(12) United States Patent
Clark et al.

(10) Patent No.: US 7,622,976 B2
(45) Date of Patent: Nov. 24, 2009

(54) SEQUENTIAL CIRCUIT DESIGN FOR RADIATION HARDENED MULTIPLE VOLTAGE INTEGRATED CIRCUITS

(75) Inventors: Lawrence T. Clark, Phoenix, AZ (US); John K. McIver, III, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 11/774,380

(22) Filed: Jul. 6, 2007

(65) Prior Publication Data
US 2008/0007312 A1 Jan. 10, 2008

Related U.S. Application Data

(60) Provisional application No. 60/818,821, filed on Jul. 6, 2006.

(51) Int. Cl.
*H03K 3/289* (2006.01)
*H03K 3/356* (2006.01)
(52) U.S. Cl. ............... 327/203; 327/202; 327/206
(58) Field of Classification Search ........ 327/202, 327/203, 208–212, 218
See application file for complete search history.

(56) References Cited

U.S. PATENT DOCUMENTS

| 7,132,856 | B2 * | 11/2006 | Hsu et al. ............ 326/81 |
| 2004/0056681 | A1 * | 3/2004 | Amick et al. ......... 326/68 |
| 2005/0193255 | A1 * | 9/2005 | McCollum .......... 714/30 |
| 2005/0280459 | A1 * | 12/2005 | Inoue ............... 327/203 |

OTHER PUBLICATIONS

John K. McIver, III and Lawrence T. Clark, Reducing Radiation-Hardened Digital Circuit Power Consumption, IEEE Transactions on Nuclear Science, vol. 52, No. 6, pp. 2503-2509, Dec. 2005. Published by IEEE, worldwide.

* cited by examiner

*Primary Examiner*—Lincoln Donovan
*Assistant Examiner*—Daniel Rojas
(74) *Attorney, Agent, or Firm*—Kennedy, Ltd.

(57) ABSTRACT

The present invention includes a radiation hardened sequential circuit, such as a bistable circuit, flip-flop or other suitable design that presents substantial immunity to ionizing radiation while simultaneously maintaining a low operating voltage. In one embodiment, the circuit includes a plurality of logic elements that operate on relatively low voltage, and a master and slave latches each having storage elements that operate on a relatively high voltage.

16 Claims, 11 Drawing Sheets

US 7,622,976 B2

SEQUENTIAL CIRCUIT DESIGN FOR RADIATION HARDENED MULTIPLE VOLTAGE INTEGRATED CIRCUITS

CLAIM OF PRIORITY UNDER 35 U.S.C. §119

The present Application for Patent claims priority to Provisional Application No. 60/818,821 entitled "Sequential Circuit Design for Radiation Hardened Multiple Voltage Integrated Circuits" filed Jul. 6, 2006, and assigned to the assignee hereof and hereby expressly incorporated by reference herein.

CONTRACTUAL ORIGIN OF THE INVENTION

The invention described herein was made with Government funding under a grant from the Sandia National Laboratories, U.S. Department of Energy, Grant No. 237095. The Government may have certain rights in this invention.

BACKGROUND

1. Field of the Present Invention

The present invention relates generally to the field of circuit design, and more specifically to the field of integrated circuits requiring radiation hardness.

2. History of the Related Art

In order to minimize active power dissipation in integrated circuits (ICs), it is common for engineers to scale the power-supply voltage $V_{DD}$. For any given circuit activity factor, $\alpha$, the power savings attributed to power scaling are attributable to the following relationship in Equation (1):

$$P_{active} = \alpha C V_{DD}^2 F. \quad (1)$$

Process scaling, which reduces $V_{DD}$ to maintain relatively constant device electric fields, has provided most of the power savings in modern very large scale integrated (VSLI) circuits. However, as die size and integration have increased, overall power consumption has risen dramatically. As such, even more innovation has been directed at the reduction in $V_{DD}$ for numerous types of circuits, especially for portable electronics having battery supplies such as those found in notebook computers, mobile telephones, and the like.

Lower power consumption is also useful in other types of circuits that are used in space applications, where power and thermal capacity are strictly limited. Additionally, lower power consumption translates directly into reductions in weight and costs, both of which are important for space-based applications. Unlike most terrestrial applications, however, space-based circuits are much more likely to be exposed to ionizing radiation, such as from a heavy ion or proton. Ionizing radiation can cause single event upsets (SEU), which introduce undesirable current into the IC. The added current is in turn responsible for single event effects (SEE), which can affect the performance and durability of the IC.

One suitable solution to mitigate both SEU and SEE is to harden the IC, which can include for example various elements or methods for attenuating or mitigating the effects of the additional current resulting from the ionizing radiation. These may include fabrication on a silicon on insulator (SOI) technology, which limits charge collection from ionizing radiation. For example, FIG. 1 illustrates a radiation hardened SRAM cell 1 that includes a first gate 2 and a second gate 3. A pair of resistors 4, 5 function to isolate the gates 2, 3 from the drain junctions, thus inserting an RC delay between the collection point and the feedback point of the circuit. With the additional RC delay, the voltage transient due to any incident radiation is attenuated by the resistors 4, 5 prior to causing any feedback to affect the logic and/or memory of the cell 1.

FIG. 2 illustrates another example circuit that is a master-slave flip-flop (MSFF) 7 that uses a pair of resistors 8, 9 in the feedback loops to provide SEE immunity. In this design, the SEE immunity is due to the fact that the latch entrance node has a high capacitance and sufficient drive to absorb any SEU-generated charge at that node. Unfortunately, however, the introduction of the resistors to harden the circuit also increases the master and slave latch setup times $t_{setup}$ proportionally to the RC time constant. There is an entire clock phase to write the slave latch as in any conventional MSFF, which, without careful design, can impact on the clock to output time ($t_{CLK2Q}$).

FIG. 3 shows the results of four test cases designed to expose the SET immunity of the circuit shown in FIG. 2. The test cases involved four different inputs into the circuit ([1] 0→1, [2] 1→0, [3] 0→0, and [4] 1→1), and as shown in FIG. 3, an SET is absorbed on the clock node before upsetting the latch state and can have a negative effect in increasing the hold time of the circuit. Moreover, an SEU can cause one node of the storage element, i.e. master or slave component, to swing in the opposite direction of the data, which also increases the setup and hold times of the circuit.

Prior attempts to harden ICs have resulted in either slower performance as measured by increased setup and/or hold times, or conversely in increased power consumption in order to immunize the latch elements from SEU and single event transients (SET). Therefore, there is a need in the art for a circuit design that provides the benefits of flexible and reduced power consumption while simultaneously protecting the circuit against SEE, SEU and SET. Such a novel and useful circuit would have numerous potential applications, and would find particular use in space-based applications in which a circuit combining lower power consumption and radiation hardness is most desired.

SUMMARY OF THE PRESENT INVENTION

Accordingly, the present invention includes a circuit that is adapted for low power consumption and radiation hardness. In its various embodiments described below, the circuit includes a master latch connected to an input and a slave latch connected to the master latch. The master latch and the slave latch each further include one or more logic gates adapted to be substantially maintained at a high voltage. The circuit described herein also includes a clock element connected to the master latch, the slave latch, and a power source, wherein the clock element adapted to cause the master latch to transition between a first state and a second state. The power source can be adapted to maintain the clock latch at a low voltage, wherein the low voltage is less than or equal to the high voltage.

As described more fully herein, the circuit is designed such that the logic elements reside on a relatively low voltage power rail, while the storage elements within the latches reside on a relatively high voltage power rail. Accordingly, the circuit can provide substantial power savings over other radiation hardened circuits while providing superior radiation hardening characteristics over other low power consumption circuits. Many other aspects, features and advantages of the present invention are described in detail below with reference to the following figures.

DETAILED DESCRIPTION OF THE PREFERRED EMBODIMENTS

The following description of the preferred embodiments is provided to enable any person skilled in the art to make or use the present invention. Various modifications to these embodiments will be readily apparent to those skilled in the art, and the generic principles defined herein may be applied to other embodiments without departing from the spirit or scope of the invention as set forth in the appended claims.

The present invention includes a radiation hardened sequential circuit, such as a bistable circuit, flip-flop or other suitable design that presents substantial immunity to SEU, SEE and SET while maintaining a low operating voltage. As such, the circuit of the present invention is particularly well-suited for certain applications in which radiation hardness and low power consumption are desirable, such as for example, circuitry for use in aerospace and/or satellite devices and/or systems.

The circuit of the preferred embodiment includes a master latch connected to an input and a slave latch connected to the master latch. The master latch and the slave latch each further include one or more logic gates adapted to be substantially maintained at a high voltage. The circuit of the preferred embodiment also includes a clock element connected to the master latch, the slave latch, and a power source, wherein the clock element may be adapted to cause the master latch to transition between a first state and a second state. In the circuit of the preferred embodiment, the power source is adapted to maintain the clock latch at a low voltage, wherein the low voltage is less than or equal to the high voltage.

Figure 4:
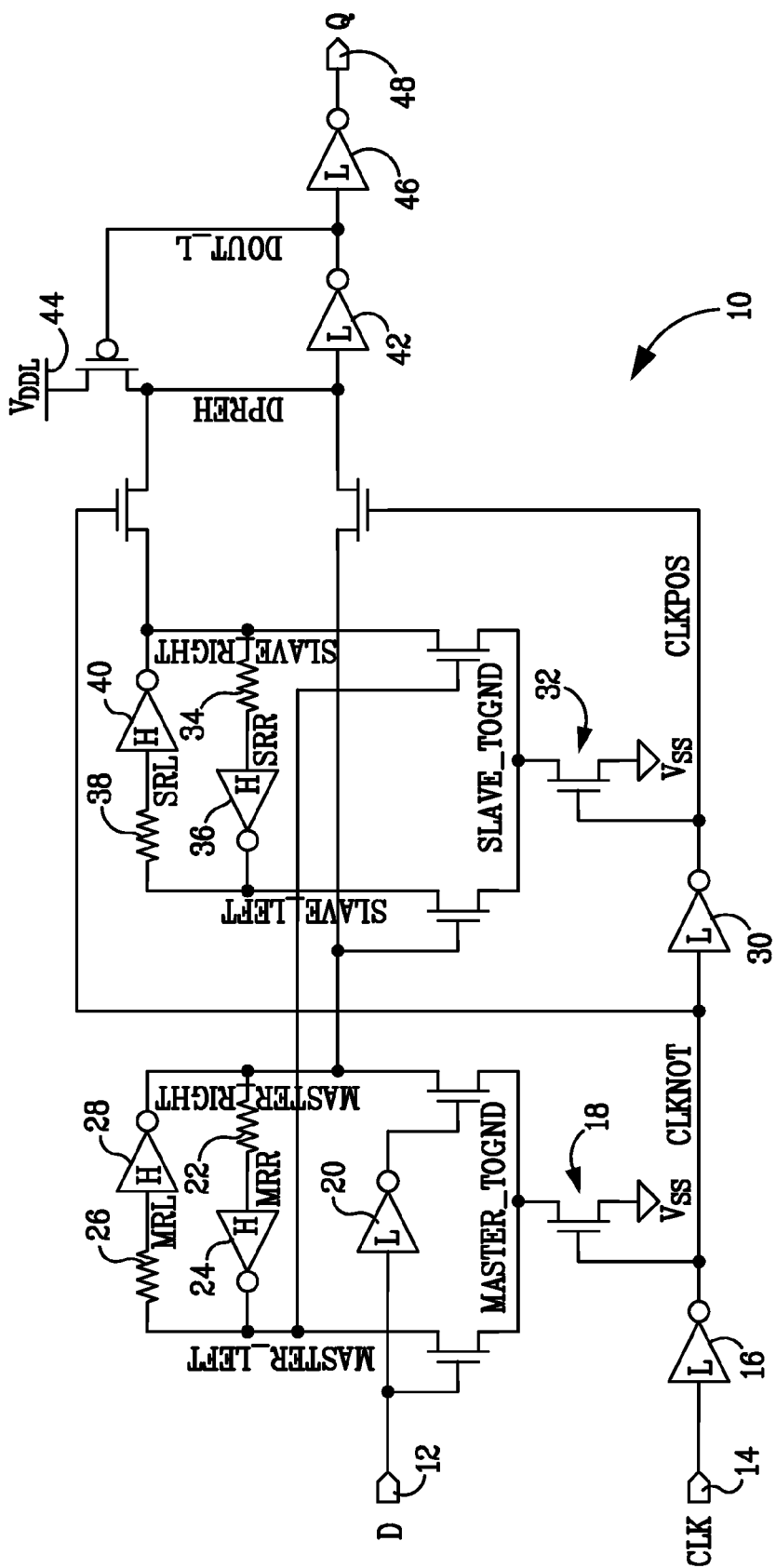
FIG. 4 is a schematic circuit diagram of a multiple voltage flip-flop circuit in accordance with a preferred embodiment of the present invention.

An exemplary configuration of the circuit 10 of the preferred embodiment is shown in FIG. 4. As shown in FIG. 4, the circuit 10 of the preferred embodiment includes a digital (D) input 12, a clock (CLK) input 14, and a digital output (Q), all of which are connected to a low power supply ($V_{DDL}$) 44. The low power supply 44 supplies power to a low power rail, which further supplies power to a series of low power logic gates 16, 20, 30, 42 and 46, the explicit function of each of which is described in more detail below.

The circuit 10 of the preferred embodiment further includes a master latch and a slave latch, both of which are connected to the D input 12. The master latch is disposed nearer to the D input 12 and can include for example a first resistor 22 connected to a first master logic gate 24 and a second resistor 26 connected to a second master logic gate 28. The first and second master logic gates 24, 28 are adapted to operate at a high voltage ($V_{DDH}$), defined herein as being equal to or greater than the voltage supplied by the low power supply 44. The circuit 10 of the preferred embodiment can further include a low power logic gate 20 disposed between the D input 12 and connected to the master latch through one or more pull down networks. The slave latch, which is disposed nearer to the Q output 48, can include a third resistor 34 connected to a first slave logic gate 36 and a fourth resistor 38 connected to a second slave logic gate 40. The first and second slave logic gates 36, 40 are also adapted to operate at a high voltage, defined above as being equal to or greater than the voltage supplied by the low power supply 44.

In variations of the circuit 10 of the preferred embodiment, the resistors 22, 26, 34, 38 can have substantially equal or substantially unequal values. One suitable value for the resistors 22, 26, 34, 38 are within a range between 70 and 210 kiloOhms. More particularly, the resistors 22, 26, 34, 38 can be approximately 140 kiloOhms. If the circuit 10 has a capacitance on the order of 4 femtoFarads, through the pull up/down networks for example, then the RC time constant would be on the order of 0.56 nanoseconds.

In other variations of the circuit 10 of the preferred embodiment, the low power supply 44 can be adapted to supply power within a range between 0.5 and 3.3 Volts, and more particularly between 1.4 and 3.3 Volts. Accordingly, the high voltage can be within a range of 0.5 and 3.3 Volts, provided that the high voltage is substantially equal to or greater than the low voltage supplied by the low power supply 44. More particularly, the high voltage can be set to a value of approximately 3.3 Volts, while the low voltage can be varied within the proscribed range of less than or substantially equal to the high voltage.

As shown in FIG. 4, the master latch and the slave latch can be configured as a differential cascode voltage switch logic (DCVSL) circuit. In this exemplary configuration, the master and slave logic gates 24, 28, 36, 40 are cross-coupled inverters (NOT gates). Use of weak PMOS transistors in the inverters for the master and slave logic gates 24, 28, 36, 40 also allows the use of a relatively stronger NMOS pull-down network, which in turn allows the circuit 10 of the preferred embodiment to be a ratioed circuit. In variations of the preferred embodiment, the master and slave logic gates 24, 28, 36, 40 can be any other suitable type of digital logic element or combination thereof that functions as a signal inverter.

In a variation of the preferred embodiment, the circuit 10 can also include a multiplexer connected to the clock element and the power source, wherein the multiplexer is adapted to select between one of the master latch or the slave latch in response to a phase of the clock element. As shown in FIG. 4, the multiplexer includes a first logic gate 16 that is connected to the master latch through a first pull-up network 18 and a second logic gate 30 that is connected to the slave latch through a second pull-up network 32. The multiplexer functions to correctly select between the master and slave latch depending on the phase of the clock as the output data. The multiplexer further functions to bypass the slave latch and decouple the write speed of the slave latch from the $t_{CLK2Q}$ of the circuit 10. In this variation of the preferred embodiment, the multiplexer elements are connected, with the clock 12, to the low power source 44.

In another variation of the circuit 10 of the preferred embodiment, the first and second logic gates 16, 30 of the multiplexer can be NMOS transistors, which provides the advantage of limiting the load on the clock 12. Moreover, the clock signals are on the low power rail supplied by the low power source 44, which when combined with the high power supply rail of the logic gates within the master and slave latches, provides a high to low level shifter. In order to restore the level of the signal at the output 48, the circuit 10 can includes a PMOS pull up network that includes a PMOS logic gate 42 coupled to an output inverter 46.

In yet another variation of the circuit 10 of the preferred embodiment, the power source 44 can be configured to operate at a first low voltage and second low voltage. In such an instance, the clock 12 can be configured to operate at the first low voltage and the multiplexer (and its associated elements) can be configured to operate at the second low voltage, wherein the first low voltage is greater than or equal to the second low voltage, and wherein both of the first low voltage and the second low voltage are less than or equal to the high voltage. By operating the clock 12 at the higher of the low voltages, the performance of the circuit 10 can be improved. However, in instances in which the circuit 10 is shifting to a lower voltage, the clock 12 can be placed on the lower of the low voltages in order to provide cascode isolation for the multiplexer.

Figure 5:
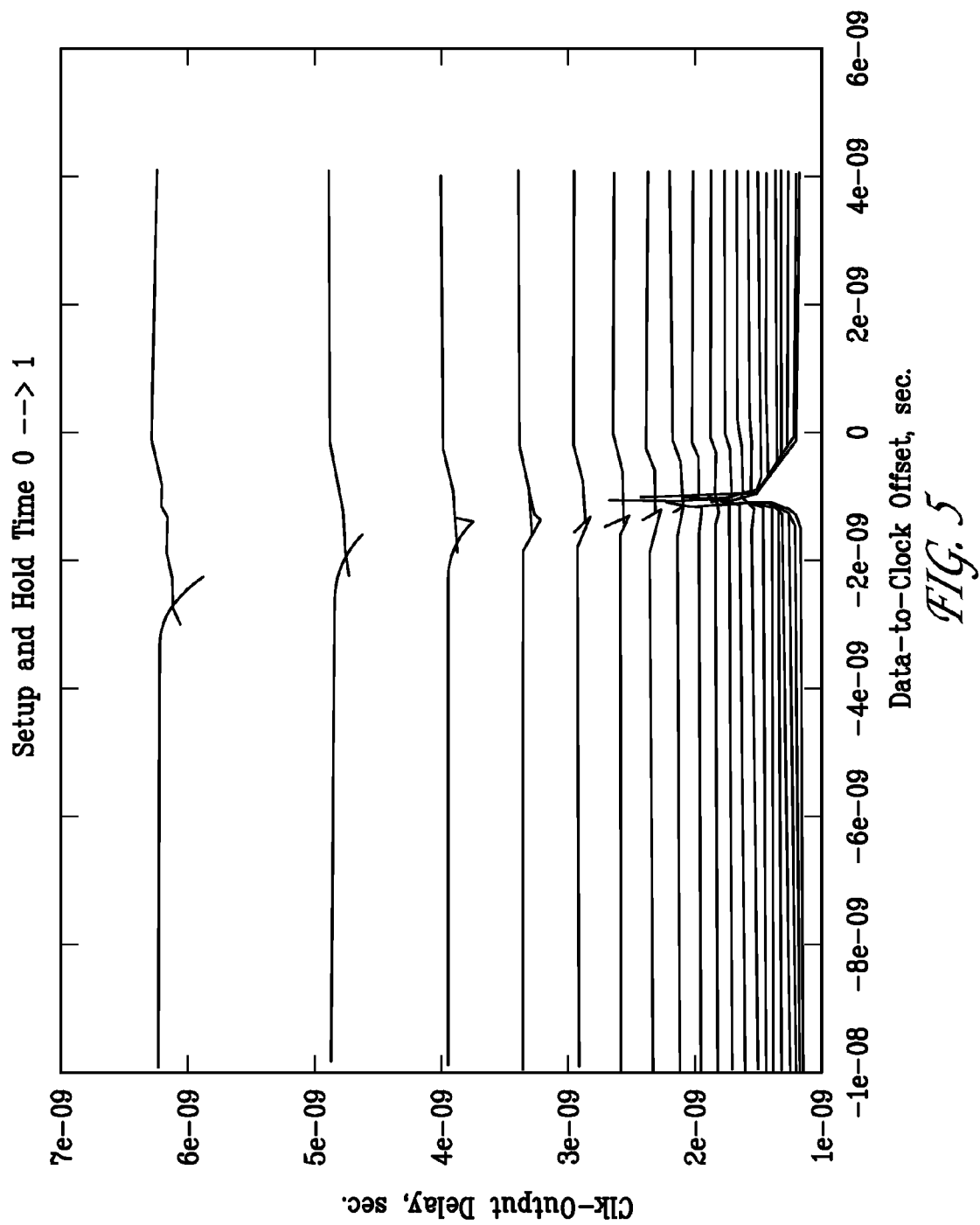
FIG. 5 is a graphical representation of the setup and hold times for the circuit shown in FIG. 4.
Figure 6:
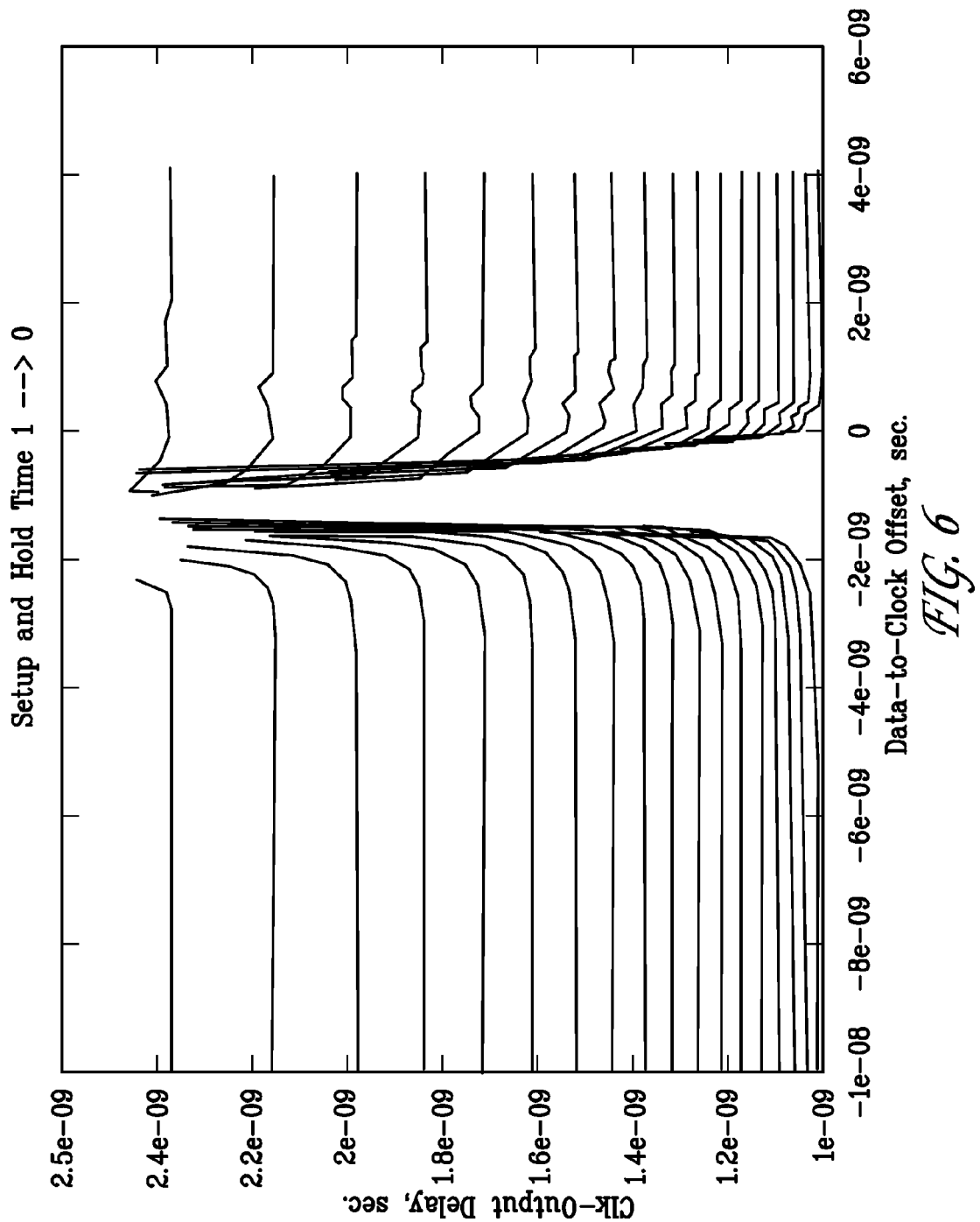
FIG. 6 is a graphical representation of the setup and hold times for the circuit shown in FIG. 4.

As noted above, the circuit 10 of the preferred embodiment simultaneously provides the benefits of radiation hardness and low power consumption. Moreover, the circuit 10 of the preferred embodiment provides these benefits while providing comparable performance to other bistable circuits. FIGS. 5 and 6 are graphical representation of the setup and hold times for the circuit shown in FIG. 4 moving between 0→1 and 1→0, respectively. The hold times are the curves on the left side of the graph, and the setup times are the curves on the right side of the graph. Each plot on FIGS. 5 and 6 corresponds to a predetermined low voltage ($V_{DDL}$), ranging between 1.4 and 3.3 V in steps of 0.1 V.

As seen in FIG. 5, the curvature of the hold time curves can be attributed to resistor delay, which can cause a greater setup time and thus greater delay in writing the latches at low values of $V_{DDL}$. As seen in FIG. 6, even the worst case setup and hold times are an improvement over the baseline circuit shown in FIG. 2, corresponding to setup and hold times of approximately 1.5 nanoseconds in the case where $V_{DDL} = V_{DDH} = 3.3V$.

Figure 7:
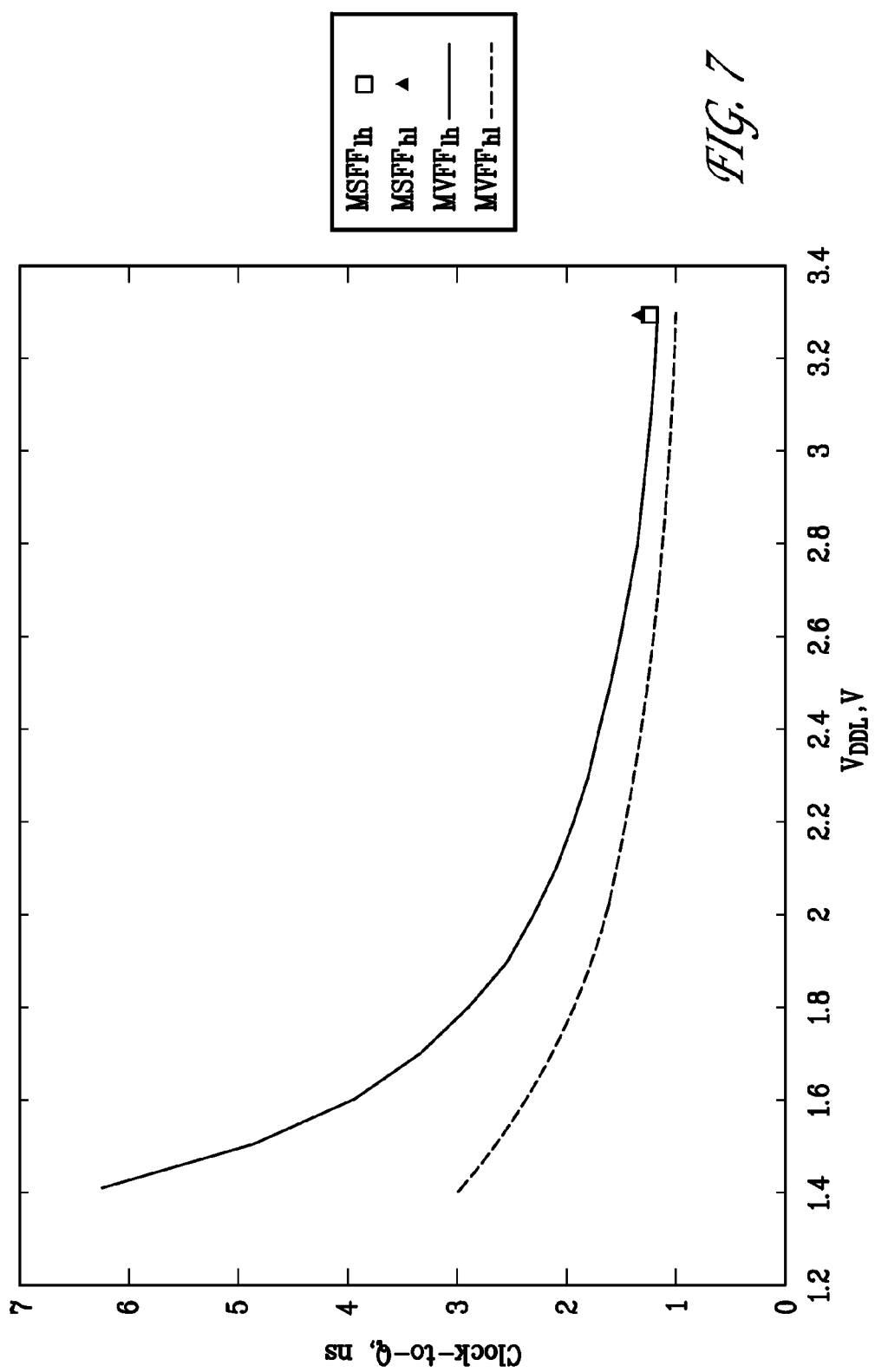
FIG. 7 is a graphical representation of the $t_{clk2Q}$ for the circuit shown in FIG. 4.

FIG. 7 is a graphical representation of the $t_{clk2Q}$ for the circuit shown in FIG. 4. The top curve corresponds to the 0→1 performance of the circuit and the bottom curve corresponds to the 1→0 performance of the circuit. As shown, the $t_{clk2Q}$ for the circuit of the preferred embodiment steadily decreases as the low voltage is increased to substantially equal to the higher voltage, for example in cases where $V_{DDL} = V_{DDH} = 3.3V$. In the latter case, it is evident that the performance of the circuit of the preferred embodiment is slightly superior to that of the circuit shown in FIG. 2, the $t_{clk2Q}$ values for which are designated by the box and triangle shown in FIG. 7.

Figure 3:
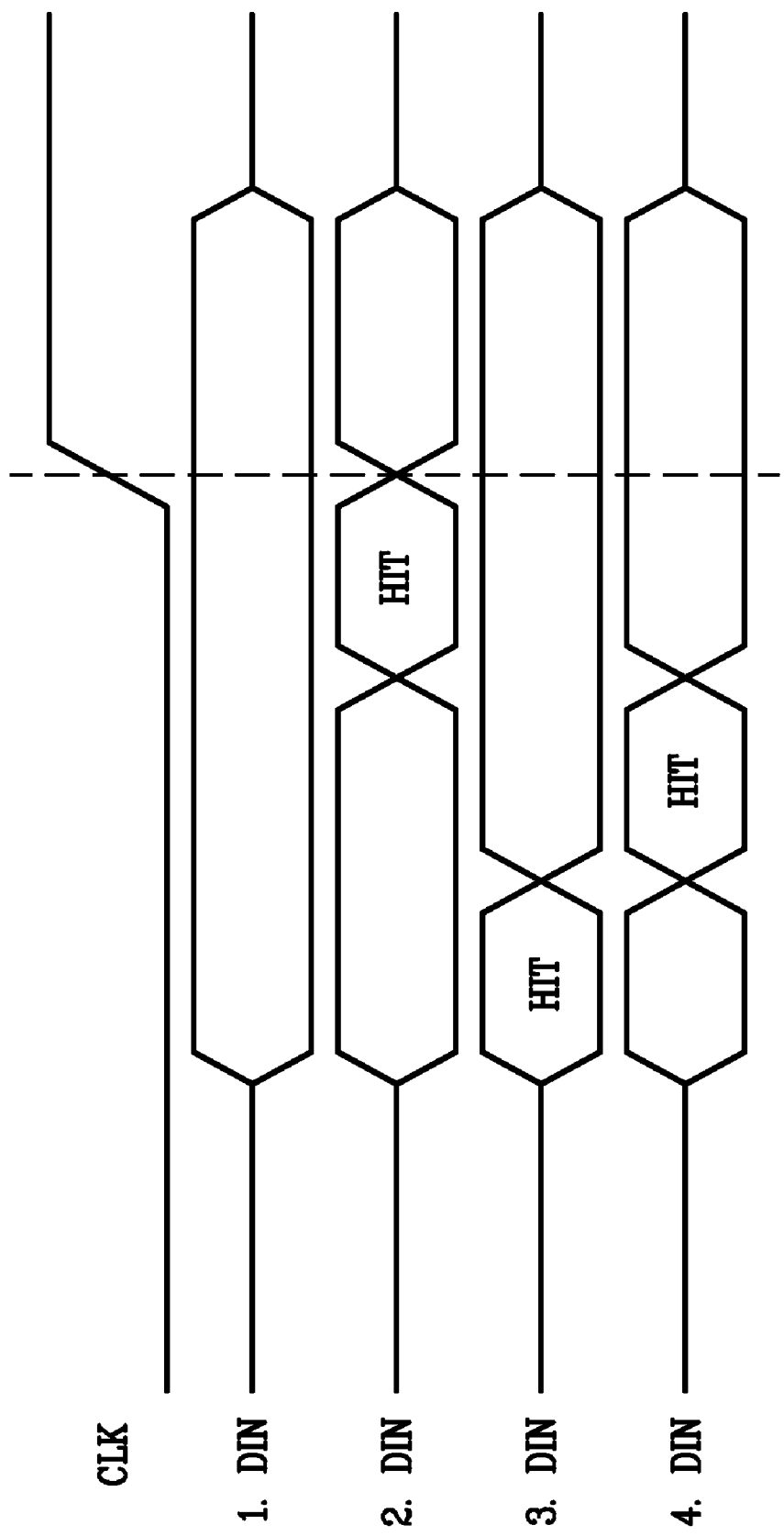
FIG. 3 is a schematic timing diagram of the effects of radiation incident on a typical integrated circuit as shown in FIG. 2.
Figure 8:
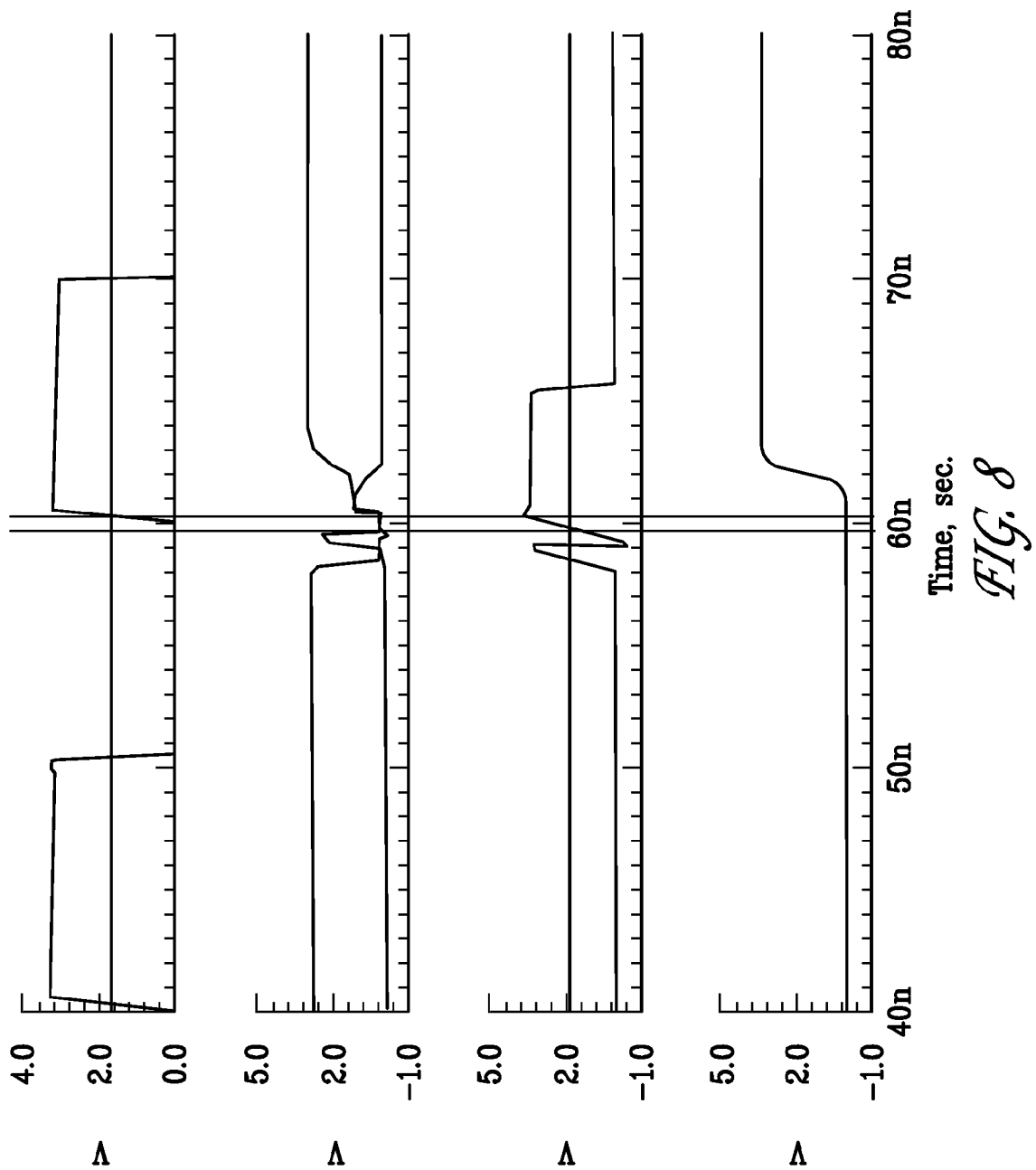
FIG. 8 is a graphical representation demonstrating the radiation hardness of the circuit shown in FIG. 4.
Figure 9:
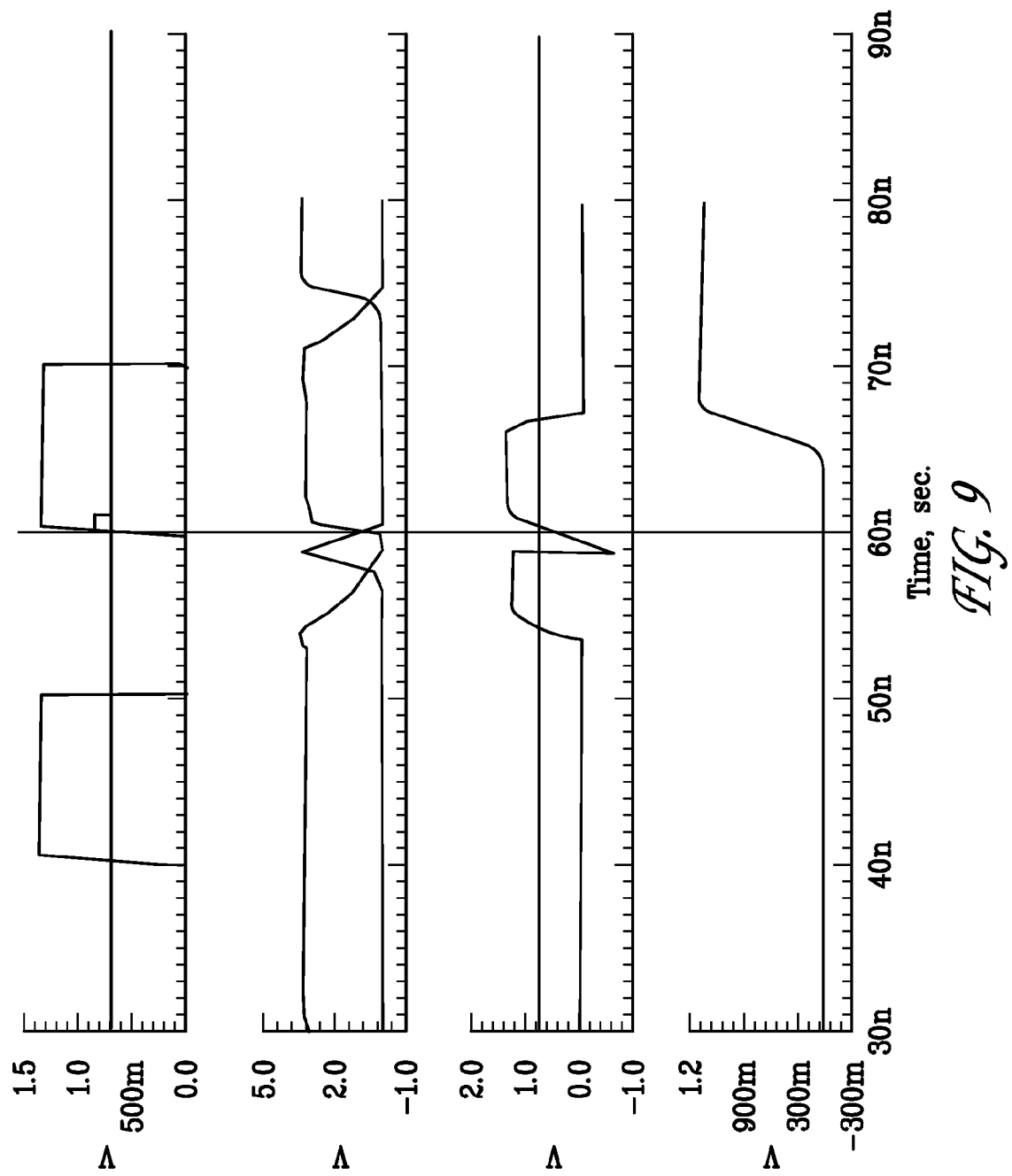
FIG. 9 is a graphical representation demonstrating the radiation hardness of the circuit shown in FIG. 4.

In order to determine the SET immunity of the circuit of the preferred embodiment, the test cases noted in FIG. 3 were repeated on the circuit of the preferred embodiment. Results of those test cases are shown in FIGS. 8 and 9. In FIG. 8, the $V_{DDL}$ is set to 3.3 V and in FIG. 9 the $V_{DDL}$ is set to 1.4 V. Test case one includes no strike and therefore has no effect on the timing. In both cases two and three, the strike occurs at the beginning of the input data assertion or just before the rising edge of the clock. In cases two and three, $t_{setup\_hard} = t_{setup} + t_{SET}$, wherein $t_{SET}$ denotes the duration of the SET. This allows the master latch to maintain stability for the $t_{setup}$ time thereby permitting the signal to propagate through 2RC delays. Both FIGS. 8 and 9 demonstrate that the circuit of the preferred embodiment has a substantial SET resistance provided that $t_{setup\_hard}$ is large enough. For example, in test case 4, $t_{setup\_hard} = t_{setup} + t_{SET}$ is insufficiently large to properly write the master latch because $t_{setup}$ is effectively halved by the SET. As such, in one variation of the circuit of the preferred embodiment, $t_{setup\_hard} = 2 \cdot t_{setup} + t_{SET}$ can be used in order to guarantee the writing of the master latch.

Figure 1:
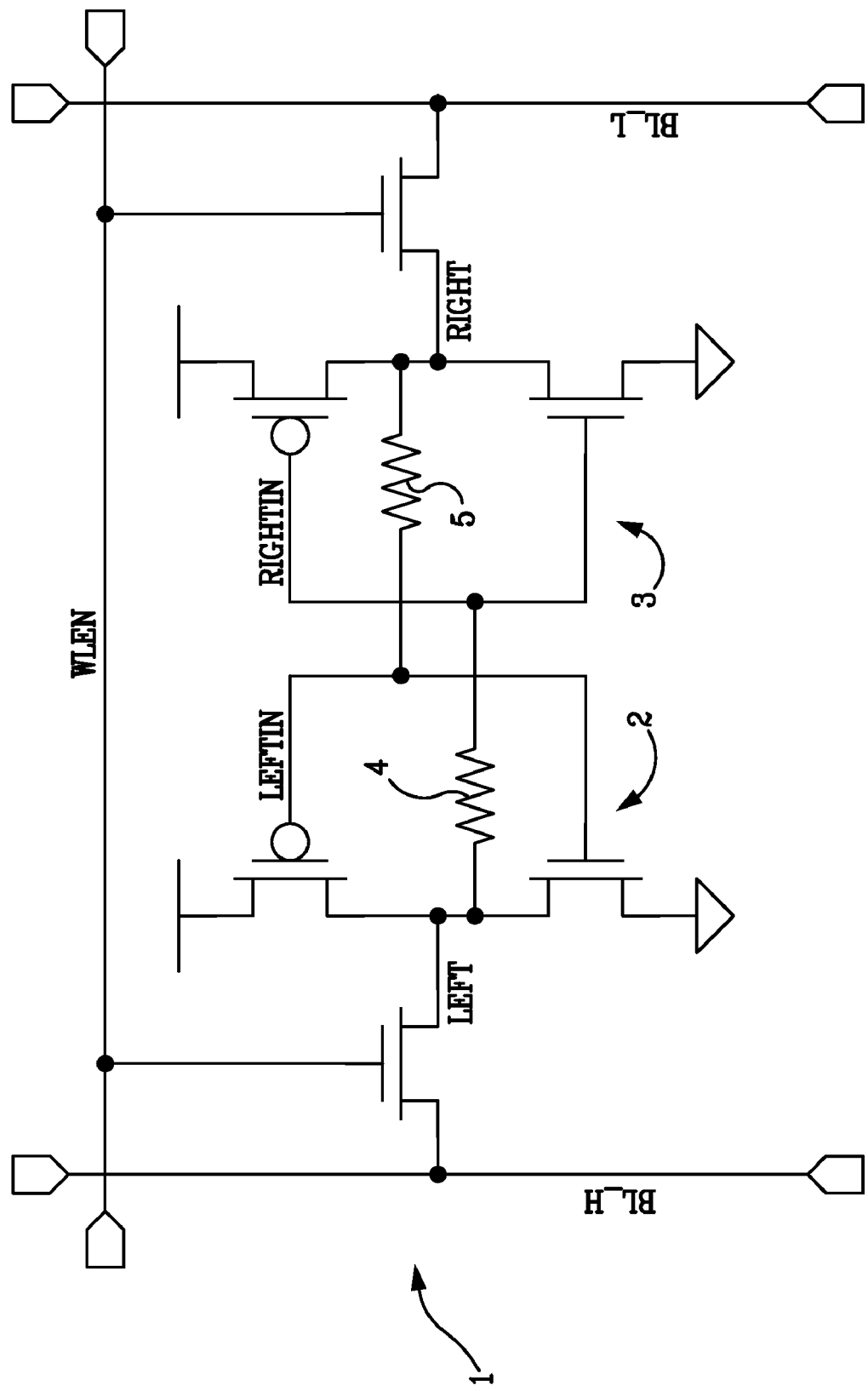
FIG. 1 is a schematic circuit diagram of a conventional flip-flop circuit disclosed in the prior art.
Figure 2:
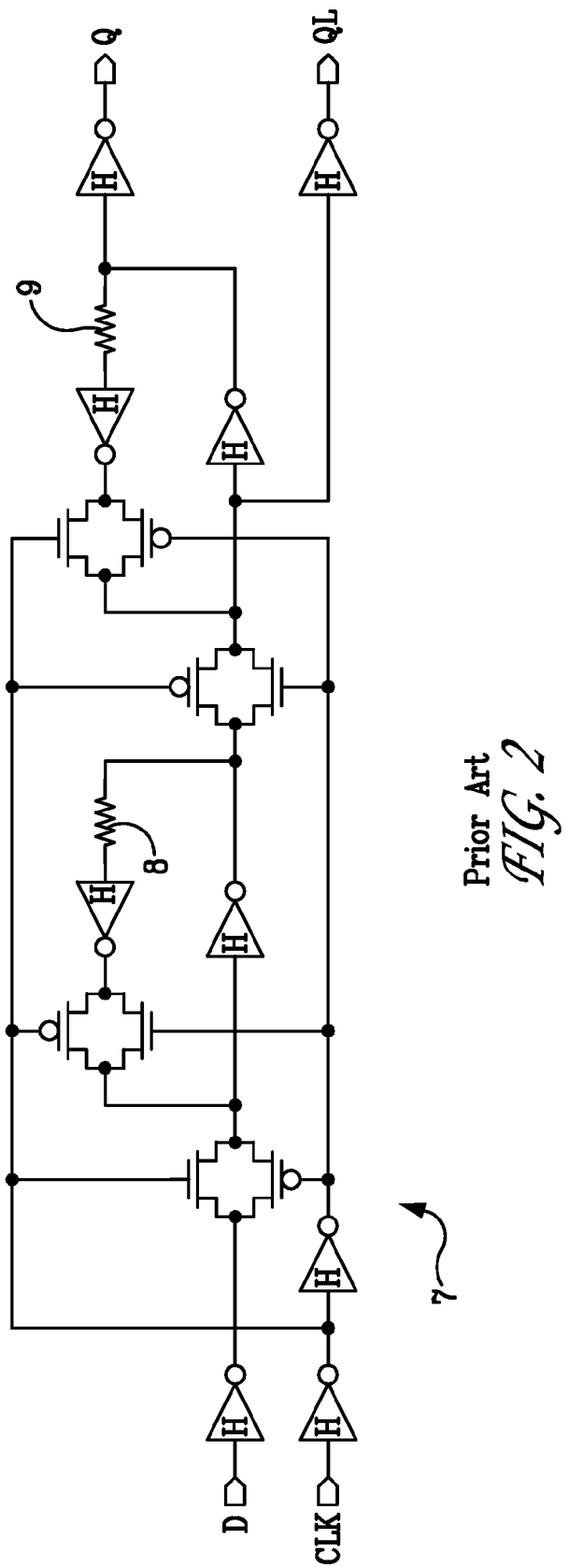
FIG. 2 is a schematic circuit diagram of another conventional flip-flop circuit disclosed in the prior art.
Figure 10:
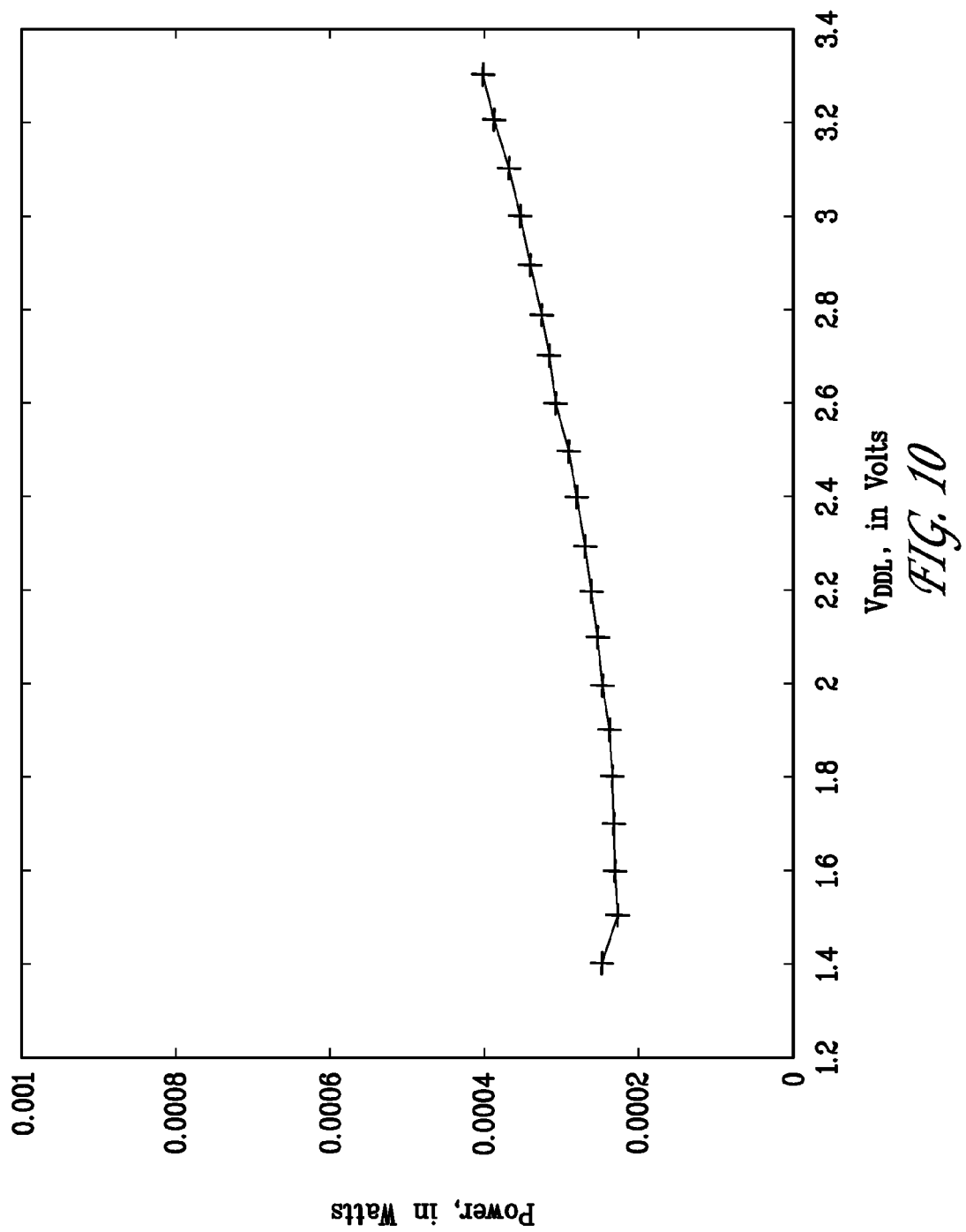
FIG. 10 is a graphical representation of the performance of the circuit shown in FIG. 4 under predetermined test conditions.
Figure 11:
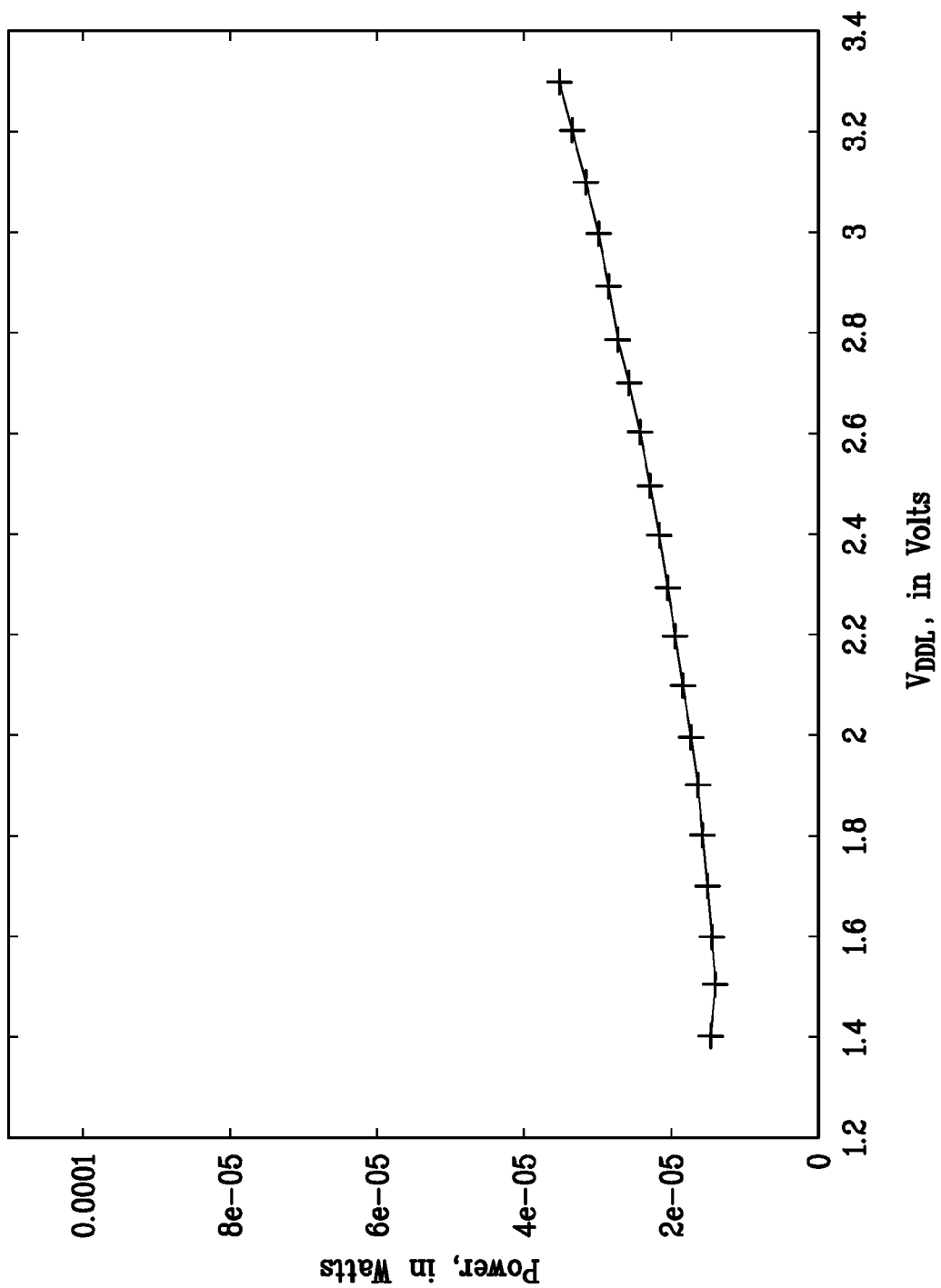
FIG. 11 is a graphical representation of the performance of the circuit shown in FIG. 4 under predetermined test conditions.

FIGS. 10 and 11 graphically illustrate the power consumption of the circuit of the preferred embodiment at different activity factors α. In FIG. 10, the activity factor α is 0.5 and in FIG. 11 the activity factor is 0.1. By way of comparison, a conventional flip-flop as shown in FIG. 2 operating at 3.3V has a power consumption of approximately 0.001 Watts for α=0.5 and 0.0001 Watts for α=0.1. As is evident from FIGS. 10 and 11, the circuit of the preferred embodiment delivers substantial power savings over a conventional circuit. As shown in FIG. 10, the power decreases with lower $V_{DDL}$ until about 1.5 volts, after which the latch power begins dominating due to the transition rate. At the 0.5 activity factor, the circuit of the preferred embodiment reduces power consumption by fifty eight percent as compared to the more conventional flip-flop circuit. In the more realistic activity factor of 0.1 shown in FIG. 11, the overall power energy per clock of the circuit of the preferred embodiment is reduced over eighty percent when compared to a conventional flip-flop such as that shown in FIG. 2.

Another advantage of the circuit of the preferred embodiment is that a state-retentive power-down mode is naturally supported by its design. By gating the $V_{DDL}$ completely off, the leakage power of that portion of the circuit can be eliminated, i.e. the clock and associated logic elements. The latch states are effectively isolated from the low voltage power supply, and the latch states are retained by the high power voltage thereby reducing the chip leakage to that required by the state retention elements, i.e. master and slave logic gates. In another variation of the circuit of the preferred embodiment, each of the master latch and the slave latch can have its own high voltage supply, thereby allowing only for the slave state to be retained.

As described above, the present invention includes a preferred embodiment and variations thereof of a low-power, radiation hardened bistable or flip-flop circuit. As noted above, the clock power can be reduced substantially over conventional CMOS pass-gate input latches by utilizing a single clock transistor, as well as by reduced clock net loading throughput. Maintaining lower voltages on the clock, input and output circuits also reduces the operating power, as shown above, by fifty-eight to eighty percent, depending upon the operating low voltage and the activity factor. SEU immunity is maintained by using a higher voltage for the storage elements to maintain $Q_{crit}$. In addition to the significant power savings, the circuit of the preferred embodiment achieves lower setup times and $t_{clk2Q}$ delays than a baseline radiation hardened circuit. Lastly, the circuit of the preferred embodiment also provides a level shifting function for mixed voltage systems, as well as a state-retentive standby power state.

The present invention has been described with reference to its preferred embodiments so as to enable any person skilled in the art to make or use the present invention. However, various modifications to these embodiments will be readily apparent to those skilled in the art, and the generic principles defined herein may be applied to other embodiments without departing from the spirit or scope of the invention as set forth in the following claims.

We claim:

1. A sequential integrated circuit comprising:
    a master latch connected to an input, the master latch comprising one or more master logic gates adapted to be substantially maintained at a high voltage and a master resistor connected to the one or more master logic gates;
    a slave latch connected to the master latch, the slave latch comprising one or more slave logic gates adapted to be substantially maintained at the high voltage and a slave resistor connected to the one or more slave logic gates;
    a clock element connected to the master latch, the slave latch, and a power source, the clock element adapted to cause the master latch to transition between a first state and a second state; and
    a multiplexer connected to the clock element and the power source, wherein the multiplexer is adapted to select either the output of the master latch or the output of the slave latch in response to a phase of the clock element;
    wherein the power source is adapted to maintain the clock element at a clock low voltage and the multiplexer at a multiplexer low voltage, and wherein the clock low voltage and the multiplexer low voltage are less than the high voltage, and further wherein the clock low voltage and the multiplexer low voltage can be varied such that the clock element and the multiplexer can operate on substantially dissimilar low voltages.

2. The circuit of claim 1 wherein the multiplexer comprises one or more NMOS transistors.

3. The circuit of claim 1 wherein the high voltage is approximately 3.3V.

4. The circuit of claim 3 wherein the low voltage is less than 3.3v.

5. The circuit of claim 1 wherein the master latch and the slave latch are cross-coupled.

6. The circuit of claim 1 wherein the one or more master logic gates comprise one or more NOT logic gates.

7. The circuit of claim 1 wherein the one or more slave logic gates comprise one or more NOT logic gates.

8. The circuit of claim 1, wherein the clock voltage is greater than or equal to the multiplexer voltage.

9. The circuit of claim 8, wherein the clock voltage is greater than the multiplexer voltage.

10. The circuit of claim 1 further comprising a pull-up element connected to the multiplexer.

11. The circuit of claim 10 wherein the pull-up element comprises a PMOS gate further connected to an output of the circuit.

12. A radiation hardened sequential circuit comprising:
    a high voltage portion operable at a high voltage and comprising a level-shifting latch comprising a pair of inverters disposed in a positive feedback configuration and coupled through one or more resistors; and
    a low voltage portion operable at a plurality of low voltages less than the high voltage, the low voltage portion connected to the high voltage portion and comprising a clock operable at a clock voltage and a multiplexer operable at a multiplexer voltage, wherein the clock voltage is greater than the multiplexer voltage.

13. The circuit of claim 12 wherein the multiplexer comprises one or more NMOS transistors.

14. The circuit of claim 12 wherein the level-shifting latch comprises a master latch cross-coupled to a slave latch.

15. The circuit of claim 12 further comprising a pull-up element connected to the multiplexer.

16. The circuit of claim 15 wherein the pull-up element comprises a PMOS gate further connected to an output of the circuit.

* * * * *